(12) United States Patent
Matsumoto

(10) Patent No.: US 7,742,023 B2
(45) Date of Patent: Jun. 22, 2010

(54) ELECTROLUMINESCENCE DISPLAY DEVICE

(75) Inventor: Shoichiro Matsumoto, Ogaki (JP)

(73) Assignee: Sanyo Electric Co., Ltd. (JP)

(*) Notice: Subject to any disclaimer, the term of this patent is extended or adjusted under 35 U.S.C. 154(b) by 936 days.

(21) Appl. No.: 11/485,526

(22) Filed: Jul. 12, 2006

(65) Prior Publication Data

US 2007/0013629 A1    Jan. 18, 2007

(30) Foreign Application Priority Data

Jul. 12, 2005   (JP)   ............... 2005-202992
Jul. 12, 2005   (JP)   ............... 2005-202993
Aug. 8, 2005    (JP)   ............... 2005-230129

(51) Int. Cl.
*G09G 3/36* (2006.01)
(52) U.S. Cl. .................. 345/76; 345/92; 345/211
(58) Field of Classification Search .......... 345/76, 345/211
See application file for complete search history.

(56) References Cited

U.S. PATENT DOCUMENTS

| | | | |
|---|---|---|---|
| 6,531,815 B1 * | 3/2003 | Okuyama et al. ........... 313/506 |
| 6,690,110 B1 * | 2/2004 | Yamada et al. ............. 313/506 |
| 6,828,723 B2 | 12/2004 | Matsumoto et al. |
| 6,867,541 B2 | 3/2005 | Okuyama et al. |
| 7,053,548 B2 * | 5/2006 | Nakanishi .................. 313/506 |
| 7,190,122 B2 * | 3/2007 | Winters et al. ............. 315/169.1 |
| 2003/0016199 A1 * | 1/2003 | Lee et al. ................... 345/88 |
| 2003/0197472 A1 * | 10/2003 | Kanauchi et al. ........... 315/169.1 |
| 2004/0104882 A1 * | 6/2004 | Kitani et al. ............... 345/100 |
| 2004/0169623 A1 * | 9/2004 | Fujita ........................ 345/76 |
| 2004/0257388 A1 * | 12/2004 | Tobita ....................... 345/690 |

* cited by examiner

*Primary Examiner*—Bipin Shalwala
*Assistant Examiner*—Afroza Y Chowdhury
(74) *Attorney, Agent, or Firm*—Cantor Colburn LLP

(57) ABSTRACT

In an electroluminescence display device having, on a display panel, a display portion in which pixels are arranged in matrix, an external connection terminal is placed along a lateral side of the display panel and a vertical scan driver circuit is placed on a lateral side of the display panel which opposes the lateral side on which the external connection terminal is placed. Lines for a horizontal scan driver circuit and for the vertical scan driver circuit can be provided only on three sides of the display panel including the side on which the external connection terminal is provided, a side opposing this side, and another side. By not placing the line for the driver circuits on the remaining side, spaces can be secured on this side for a drive current line which supplies power to an electroluminescence element. With this structure, a size of a frame portion can be reduced while securing sufficient width for the drive current common line.

28 Claims, 10 Drawing Sheets

ELECTROLUMINESCENCE DISPLAY DEVICE

CROSS-REFERENCE TO RELATED APPLICATIONS

The entire disclosures of Japanese Patent Applications Nos. 2005-202992, 2005-202993, and 2005-230129, including their specifications, claims, drawings, and abstracts, are incorporated herein by reference.

BACKGROUND OF THE INVENTION

1. Field of the Invention

The present invention relates to a layout in a display panel in which an electroluminescence element (hereinafter simply referred to as "EL element") is used as a display element in each of pixels arranged in a matrix.

2. Description of the Related Art

Display devices which use EL elements, in particular, organic EL elements which are current-driven light emitting elements as a display element in each pixel, are known. Among EL display devices, active matrix display devices in which a transistor (thin film transistor or "TFT") is provided in each pixel for individually driving, for each pixel, the organic EL element provided in each pixel are now a focus of development.

FIG. 1 exemplifies an equivalent circuit corresponding to a pixel in an active matrix display device. A gate line GL is provided along a horizontal scan direction (row direction) of the display device and a data line DL and a power supply line PL are provided along a vertical scan direction (column direction) of the display device. Each pixel comprises a selection transistor Ts which is an n-channel thin film transistor, a storage capacitor Cs, a p-channel element driving transistor Td, and an organic EL element 55. The selection transistor Ts has a drain connected to a common data line DL which supplies a data voltage to pixels positioned along the vertical scan direction, a gate connected to a gate line GL for selecting pixels positioned along the horizontal scan direction, and a source connected to a gate of the element driving transistor Td.

The element driving transistor Td is a p-channel thin film transistor and has a source connected to the power supply line PL and a drain connected to an anode of the organic EL element 55. A cathode of the organic EL element 55 is formed common to the pixels and is connected to a cathode power supply CV. One electrode of the storage capacitor Cs is connected between the gate of the element driving transistor Td and the source of the selection transistor Ts. The other electrode of the storage capacitor Cs is connected to a power supply of a constant voltage such as, for example, ground and a power supply line.

In this circuit, when the gate line GL is set to the H level, the selection transistor Ts is switched on, a data voltage on the data line DL is supplied via the selection transistor Ts to the gate of the element driving transistor Td, the element driving transistor Td allows a drive current corresponding to the gate voltage of the element driving transistor Td to flow from the power supply line PL to the organic EL element 55, and light is emitted from the organic EL element 55 at brightness corresponding to the drive current. The data voltage on the data line DL is supplied to the storage capacitor Cs in addition to the element driving transistor Td and a voltage corresponding to the data voltage is stored in the storage capacitor Cs. Therefore, even when the gate line GL is set to an L level, the element driving transistor Td continues to supply the drive current because a voltage stored in the storage capacitor Cs continues to be applied to the element driving transistor Td, and, thus, the organic EL element 55 continues to emit light at brightness corresponding to the drive current.

FIG. 2 is a conceptual view schematically showing a planar structure of a panel 100 used in an active matrix organic EL display device having a built-in driver as disclosed in Japanese Patent Laid-Open Publication No. 2001-102169 (hereinafter referred to as "Reference 1"). In FIG. 2, the outermost solid line represents a transparent panel substrate 102 and a display region 104, shown by a dotted line and in which the above-described pixels are arranged in a matrix form, is positioned at a position slightly above the center of the panel substrate 102. A horizontal scan driver circuit 106 (hereinafter referred to as "H-related driver") which is connected to the data line DL is formed along an upper side of the display region 104 and vertical scan driver circuits 108 (hereinafter referred to as "V-related driver") which are connected to the gate lines GL are formed along the right and left sides of the display region 104. These drivers 106 and 108 comprise a thin film transistor or the like which is formed simultaneously with the thin film transistors provided in each pixel.

The thick solid line extending in the display region 104 along the vertical direction indicates the power supply line PL. Individual power supply line PL is connected to a wide portion 110 in the horizontal direction which extends along the lower side of the display region 104 and forms a comb shape as a whole. The wide portion 110 is further connected, near the center of the wide portion 110, to another wide portion 112 extending along the vertical direction. The wide portion 112 is connected to an input terminal T1 for the drive power supply placed at the lower side of the organic EL display panel 100.

In addition to the terminal T1, a plurality of additional terminals, including a cathode terminal T2, a terminal T3 connected to the V-related driver 108, and a terminal T4 connected to the H-related driver 106, are located on the lower side of the organic EL display panel 100.

A line for supplying power to the H-related driver 106 extends from the terminal T4 at the lower side of the display panel 100 and along the lower side, right side, and upper side of the display region 104 and reaches a position which is almost at the left end of the upper side. A line for supplying power to the V-related driver 108 located on the left side extends from the terminal T3 along the lower side and the left side, and reaches the upper end of the left side. A line for supplying power to the V-related driver 108 placed on the right side extends from the terminal T3 along the lower side and the right side, and reaches the upper end of the right side. In actual devices, a shift register or the like comprising a TFT is provided in the rectangular region shown in the figure as the H-related driver and the V-related driver. A power supply line for driving these circuit elements extends to an end portion of the driver.

Japanese Patent Laid-Open Publication No. 2004-4797 (hereinafter referred to as "Reference 2") discloses a display device in which the external connection terminal is provided on the lower side, the H-related driver is provided on the upper side, and the V-related driver is provided on the left side. As shown in FIG. 7 of Reference 2, a line for a higher voltage power supply (Vdd) of the power supply lines of the driver extends from the lower side to the right side and supplies a higher voltage power supply to the H-related driver on the upper side and further extends from the H-related driver to the V-related driver formed on the right side. A line for a lower voltage power supply (Vss) extends from the lower side to the left side, supplies the power supply of the lower voltage to the V-related driver, and further extends from the V-related driver to the H-related driver on the upper side. In this manner, the two power supply liens are placed in rotations opposite to each other and only one of the lines is placed on the side on which neither the H-related driver nor the V-related driver is provided. With this configuration, the space required for the line can be reduced.

In the device of Reference 1, the lines for supplying power to the H-related driver and to the V-related driver are provided on four sides of the display device. At the lower side, the line for the driver and the wide portion 110 connected to the power supply line PL are provided, and a contact region extending from the cathode terminal to the common cathode electrode of the EL elements is also provided. Because of this structure, it is difficult to reduce a width of a portion between the display region 104 and the panel substrate 102, that is, the frame portion, on the side on which the external connection terminal is formed. In addition, because the width of the frame portion of the lower side is larger compared to those of the other sides, there is a constraint in the layout when such a display panel is integrated into various devices as a display device.

Other devices are known having the V-related driver 108 placed on one side at the left or right sides, rather than having two V-related drivers 108 on the both sides. However, in these devices also, a line for supplying power must extend into a portion of the lower side, limiting reduction of the width of the frame portion.

The space required for the lines can be partially reduced by employing the structure of the device of Reference 2 in which one of the two power supply lines is laid out in a clockwise manner and the other power supply line is laid out in a counterclockwise manner, but in such a case the line itself is elongated. In particular, in the structure of Reference 2, because a high-speed operation is required for the H-related driver, the power supply line Vdd for supplying the high voltage power supply extends from the external connection terminal to the H-related driver and further to the V-related driver, as described above. In other words, the power supply line Vdd extends from the lower side of the panel and along the right side, upper side, and left side in this order. Thus, the total cumulative length of the power supply line Vdd which extends along the four sides of the panel is great, even in comparison with the power supply line Vss for the lower voltage. When the line is elongated in this manner, additional factors such as, for example, generation of voltage drop and increase of power consumption must then be considered.

SUMMARY OF THE INVENTION

The present invention advantageously optimizes the layout of lines to improve the line efficiency, narrow edges, and unify the width of the frame portions.

According to one aspect of the present invention, there is provided an electroluminescence display device comprising a display panel having a display portion in which pixels are arranged in a matrix and a horizontal scan driver circuit and a vertical scan driver circuit each of which is formed at a periphery of the display portion and each of which drives the pixels, wherein an external connection terminal is placed on a first side of the display panel, one of the horizontal scan driver circuit and the vertical scan driver circuit is placed on a second side which opposes the first side, the other one of the horizontal scan driver circuit and the vertical scan driver circuit is placed on a third side which is one of two sides connecting the first side and the second side, and each of a power supply line for the horizontal scan driver circuit and a power supply line for the vertical scan driver circuit extends from the external connection terminal to a region of formation of a corresponding one of the horizontal scan driver circuit and the vertical scan driver circuit without passing through a side other than the first side, the second side, and the third side.

According to another aspect of the present invention, it is preferable that, in the electroluminescence display device, the vertical scan driver circuit can be placed on the second side.

According to another aspect of the present invention, it is preferable that, in the electroluminescence display device, the power supply line for the horizontal scan driver circuit and the power supply line for the vertical scan driver circuit can be connected to a common external connection terminal.

According to another aspect of the present invention, it is preferable that, in the electroluminescence display device, the power supply line for the horizontal scan driver circuit and the power supply line for the vertical scan driver circuit can be connected in series.

According to another aspect of the present invention, it is preferable that, in the electroluminescence display device, the power supply line for the horizontal scan driver circuit and the power supply line for the vertical scan driver circuit branch from a power supply line extending from an external connection terminal and are connected to the respective driver circuits.

According to another aspect of the present invention, it is preferable that, in the electroluminescence display device, when the power supply line for the horizontal scan driver circuit and the power supply line for the vertical scan driver circuit are connected in series, a width of a power supply line having a longer line distance from the external connection terminal is set narrower than a width of a power supply line having a shorter line distance.

According to another aspect of the present invention, it is preferable that, in the electroluminescence display device, when the power supply line for the horizontal scan driver circuit and the power supply line for the vertical scan driver circuit are connected in series, the power supply line for the horizontal scan driver circuit and the power supply line for the vertical scan driver circuit include a line for a higher voltage power supply and a line for a lower voltage power supply, at least one of which being provided in a plurality, and the plurality of the power supply lines are electrically connected to each other by a bypass line which is formed of a conductive layer different from a material for the power supply line at least at an end region of a driver circuit, of the horizontal scan driver circuit and the vertical scan driver circuit, having a shorter power supply line distance from the external connection terminal.

According to another aspect of the present invention, it is preferable that, in the electroluminescence display device, each of a signal line for the horizontal scan driver circuit and a signal line for the vertical scan driver circuit extends from the external connection terminal to a region of formation of a corresponding one of the horizontal scan driver circuit and the vertical scan driver circuit without passing through a side other than the first side, the second side, and the third side.

According to another aspect of the present invention, it is preferable that, in the electroluminescence display device, the first side, that is, the side on which the external connection terminal is placed, is a side along the vertical scan direction of the display panel.

According to another aspect of the present invention, it is preferable that, in the electroluminescence display device, the third side is a side along the horizontal scan direction of the display panel and which opposes a side on which a common line for a drive power line for supplying drive power to an electroluminescence element in each pixel is placed.

According to another aspect of the present invention, there is provided an electroluminescence display panel comprising a display portion in which pixels are arranged in a matrix and a horizontal scan driver circuit and a vertical scan driver circuit each of which is formed at a periphery of the display portion and each of which drives the pixels, wherein an external connection terminal is placed on a first side of the display panel and the vertical scan driver circuit is placed on a second side which opposes the first side.

According to another aspect of the present invention, it is preferable that, in the electroluminescence display panel, a contact region between a common electrode of an electroluminescence element in each pixel and a common electrode line extending from an external connection terminal corresponding to the common electrode is placed on the first side.

According to another aspect of the present invention, there is provided an electroluminescence display device having, on a display panel, a display portion in which pixels are arranged in a matrix, wherein external connection terminals are placed on a lateral side of the display panel along a vertical scan direction, the external connection terminals include a terminal for a horizontal scan driver circuit, a terminal for a cathode power supply, and a terminal for a pixel drive power supply, and an order of arrangement of these terminals is, from an upper side along the vertical scan direction of the display panel, the terminal for the horizontal scan driver circuit, the terminal for the cathode power supply, and the terminal for the pixel drive power supply.

According to another aspect of the present invention, there is provided an electroluminescence display device having, on a display panel, a display portion in which pixels are arranged in a matrix, wherein external connection terminals are placed on a lateral side of the display panel along a vertical scan direction, and, of the external connection terminals, a terminal for a pixel drive power supply is placed at a position lower than a center position of the display portion along the vertical scan direction.

According to another aspect of the present invention, there is provided an electroluminescence display device having, on a display panel, a display portion in which pixels are arranged in a matrix, wherein an external connection terminal is placed along a lateral side of the display panel, and a vertical scan driver circuit is placed on a lateral side of the display panel which opposes the lateral side on which the external connection terminal is placed.

It is possible to supply power to the horizontal scan driver circuit and the vertical scan driver circuit built into a panel along with the display portion through the external connection terminal provided on a side of the panel along the vertical scan direction. In addition, the supply of power can be realized by a minimum number of the external connection terminals and power supply lines. With this structure, it is possible to reduce the size of the edge of the panel and reduce power consumption.

By using a common external connection terminal for the power supply line for the horizontal scan driver circuit and for the power supply line for the vertical scan driver circuit, using a common power supply line for the two driver circuits, and connecting the power supply lines in series, it is possible to further reduce the number of lines. In addition, in such a configuration, by widening the width of the power supply line for the driver circuit having a shorter line distance to the external connection terminal and the width of the power supply line for the driver circuit having a higher operation speed, it is possible to easily and reliably supply power without a voltage drop to a driver circuit which is provided with a longer line distance and which shares the power supply line.

When the lines are placed in series, it is possible to reliably supply the power to the driver circuit having a longer line distance by providing a plurality of lines for at least one of the line for a higher voltage power supply and the line for a lower voltage power supply. Moreover, it is possible to further reduce the line resistance by connecting the plurality of power supply lines to each other.

By connecting the power supply line for the horizontal scan driver circuit and the power supply line for the vertical scan driver circuit to a common external connection terminal and branching the line to connect one of the branches to the horizontal scan driver circuit and the other of the branches to the vertical scan driver circuit, it is possible to reduce the number of lines and terminals up to the point of branching. In addition, by branching the lines, it is possible to reduce the influences of the voltage drop in one of the driver circuits on the other driver circuit.

By providing he vertical scan driver circuit on a second side which opposes the first side on which the external connection terminal is provided, it is possible to place the horizontal scan driver circuit on a third side which is in contact with the vertical scan driver circuit. In this manner, the line distance to the driver circuits can be easily minimized. Furthermore, it is not necessary to provide a power supply line or the like for the driver circuit on a fourth side opposing the third side on which the horizontal scan driver circuit is placed. Thus, a drive line portion for supplying the driving power to the electroluminescence element can be formed with a wide width on the fourth side and the variation or the like of light emission brightness of the electroluminescence elements on a display screen due to the voltage drop in the drive line portion can be reliably reduced.

Because it is not necessary to place either a driver circuit or drive line portion for the electroluminescence element on the first side, it is possible to place, on the first side, a contact region between the common electrode of the electroluminescence elements of the pixels and the common electrode line extending from the external connection terminal corresponding to the common electrode, and, thus, the size of the contact region can easily be maximized to reduce the line resistance.

By placing, among the external connection terminals, the terminal for horizontal scan-related line, terminal for the cathode power supply, and the terminal for pixel driving power supply in this order from an upper side toward the lower side, it is possible to reduce the length of the line without significantly changing the conventional layout. By reducing the line length, it is possible to inhibit power loss in this portion.

By placing the terminal for the pixel driving power supply at a position lower than a center line extending along a horizontal direction of the display region of the display device, it is possible to shorten the length of the line through which the drive current flows, and, thus reduce the line load such as the line resistance. In this manner, it is possible to inhibit the power loss in these portions.

By placing the vertical scan driver circuit of the display device adjacent to a lateral side opposing the lateral side on which the external connection terminal is provided, it is possible to efficiently use the region at the periphery of the display region for sealing the organic EL element. In other words, the vertical scan driver circuit is placed below the region for sealing to effectively use the space. This configuration is advantageous in narrowing the width of the frame portion, that is, a region between the display region and the edge of the panel substrate, in equating or approximately equating the width of the frame portions, reducing the deviation of origins of the panel substrate and the display region, and reducing the outer size of the panel substrate.

BRIEF DESCRIPTION OF THE DRAWINGS

Preferred embodiments of the present invention will be described in detail by reference to the drawings, wherein.

DESCRIPTION OF THE PREFERRED EMBODIMENTS

Figure 1:
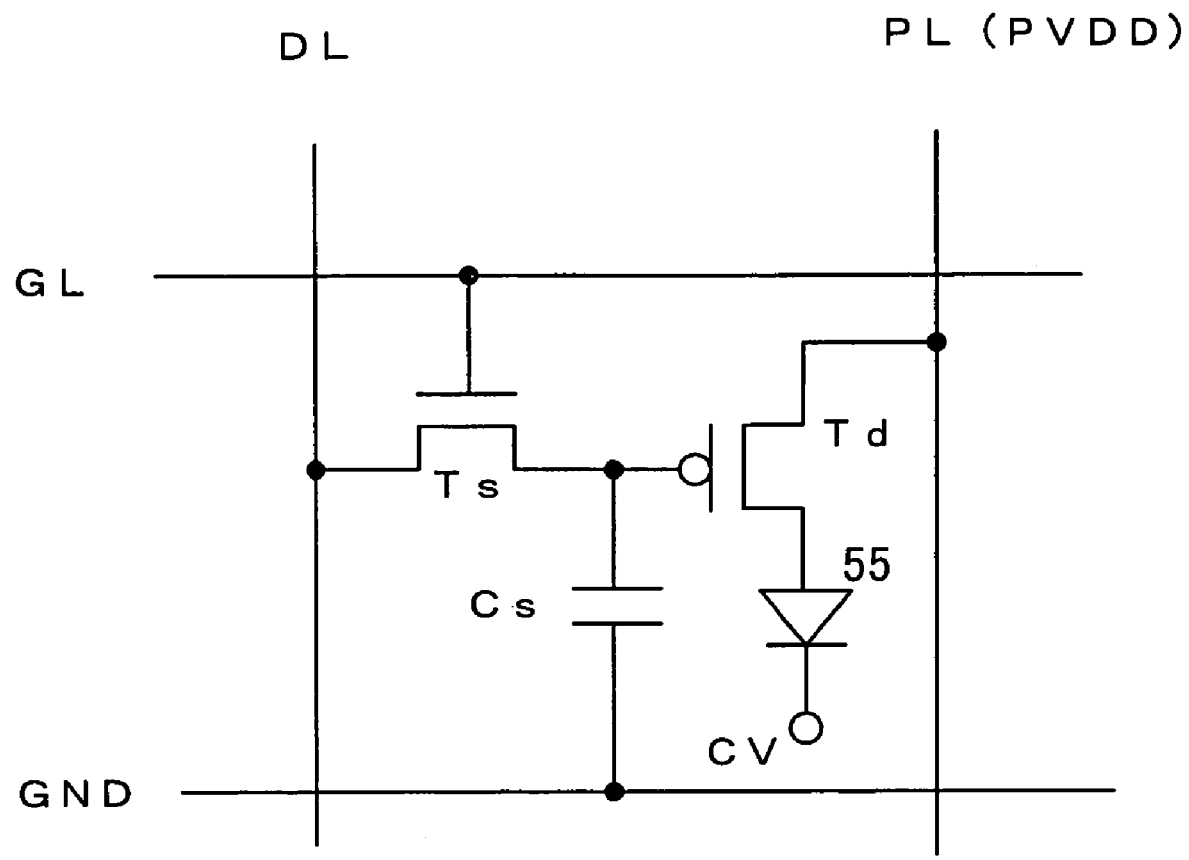
FIG. 1 is a diagram showing an equivalent circuit of a pixel of an EL display device.
Figure 2:
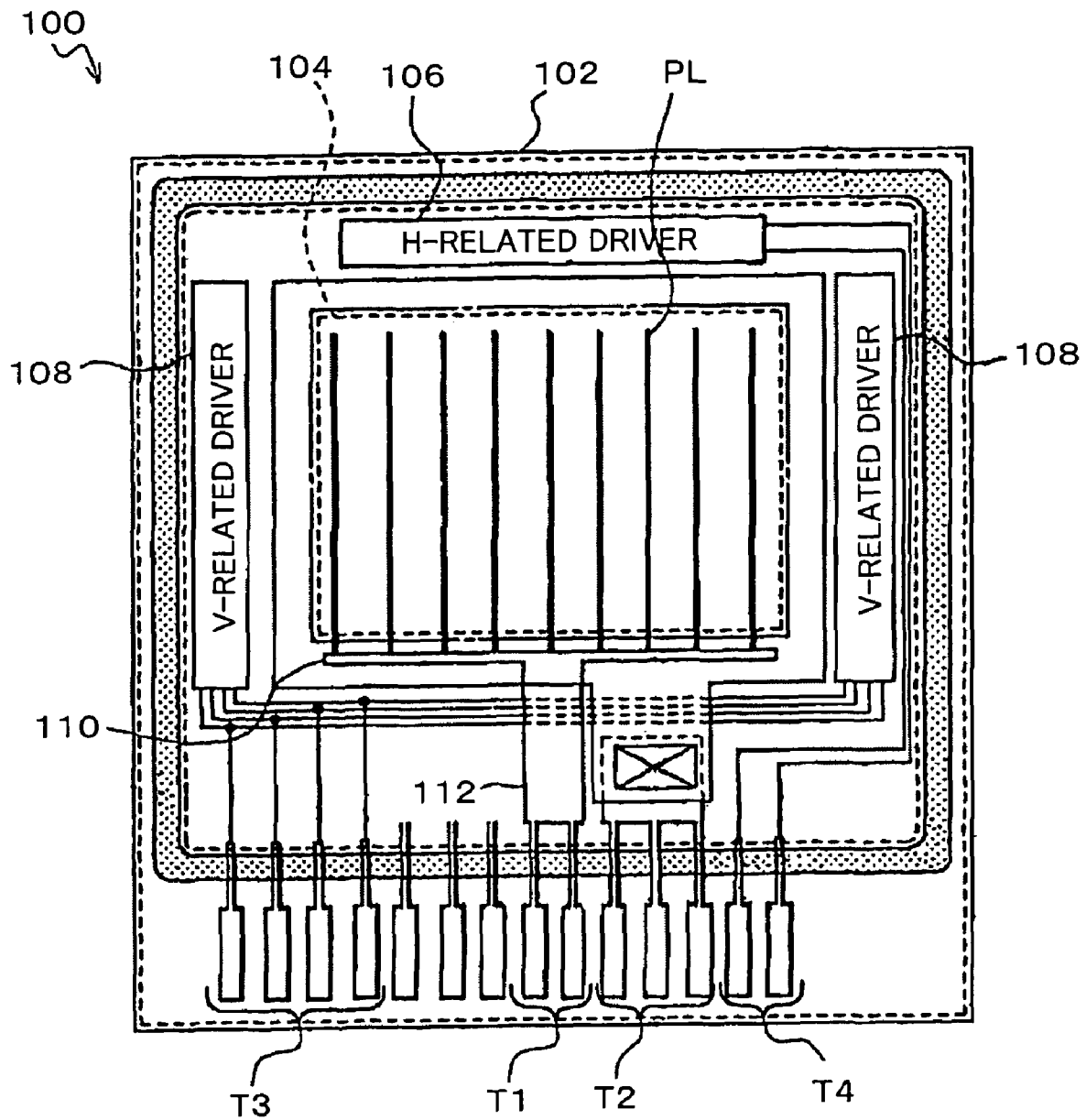
FIG. 2 is a diagram showing a placement of a terminal, a line, a circuit, or the like in an EL display device of related art.
Figure 3:
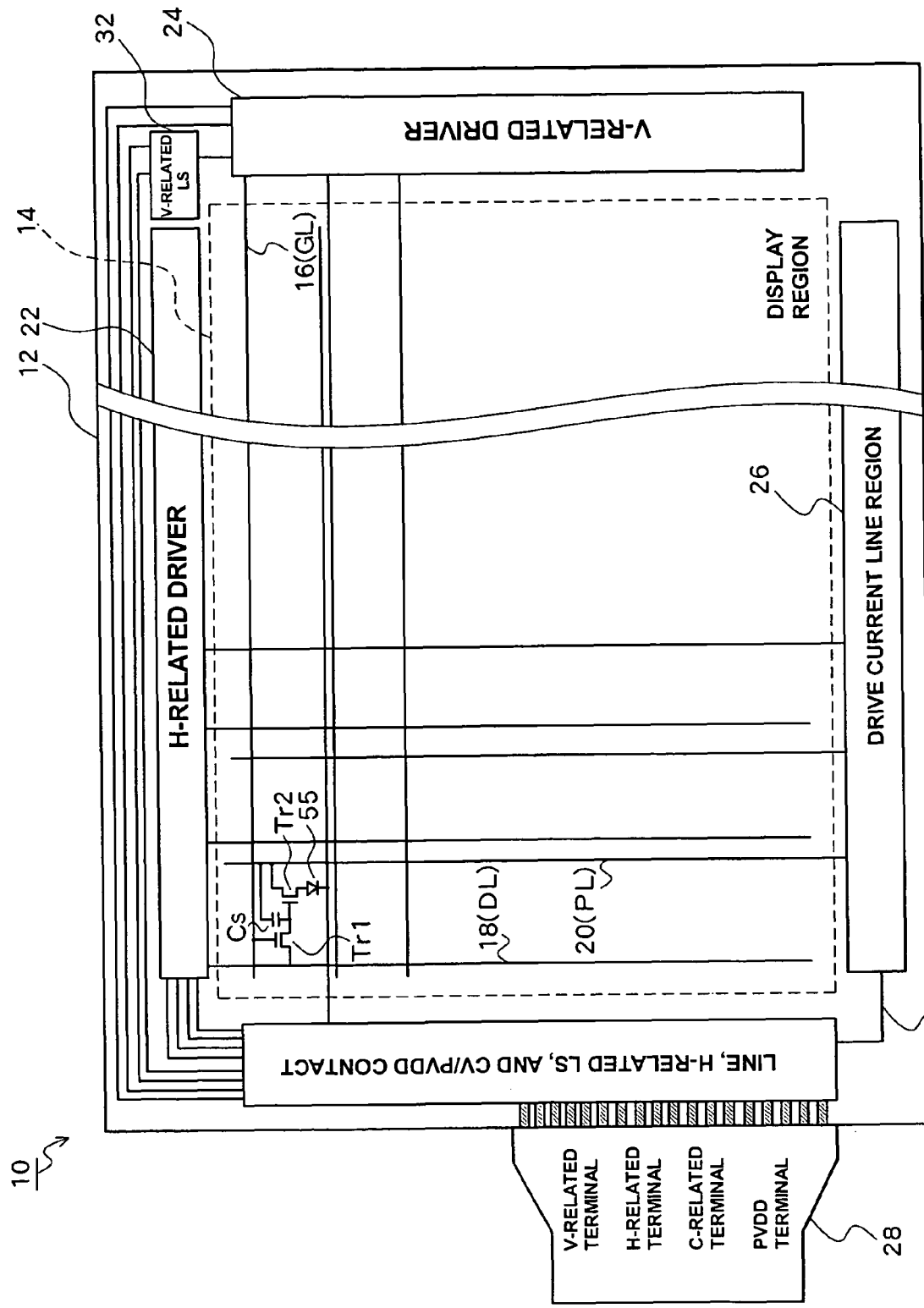
FIG. 3 is a diagram schematically showing a structure of an EL display panel of a preferred embodiment of the present invention.

Preferred embodiments of the present invention will now be described referring to the drawings. FIG. 3 is a diagram schematically showing a placement of an EL display panel 10 according to a preferred embodiment of the present invention. A display region (display portion) 14 is formed on a panel substrate 12 with a plurality of pixels arranged in a matrix form. In the display region 14, a gate line 16 (GL) to which a selection signal is sequentially output is formed along a horizontal scan (row) direction of the matrix and a data line 18 (DL) to which a data signal is output and a power supply line 20 (PL) for supplying an operational power supply (PVDD) to an organic EL element which is an element to be driven are formed along a vertical scan (column) direction.

Each pixel is approximately provided at a region defined by these lines and comprises, as circuit structures, an organic EL element which is an element to be driven, a selection transistor Tr1 which is an n-channel thin film transistor, a storage capacitor Cs, and an element driving transistor Tr2 which is a p-channel thin film transistor. The selection transistor Tr1 has a drain connected to a data line 18 for supplying a data voltage to pixels along the vertical scan direction, a gate connected to a gate line 16 for selecting pixels along a horizontal scan line, and a source connected to a gate of the element driving transistor Tr2. The element driving transistor Tr2 has a source connected to a power supply line 20 and a drain connected to an anode of the organic EL element 55. A cathode of the organic EL element 55 is formed common to the pixels and is connected to a cathode power supply CV. One electrode of the storage capacitor Cs is connected to the gate of the element driving transistor Tr2 and the source of the selection transistor Tr1 and the other electrode of the storage capacitor Cs is connected to a constant potential such as, for example, the power supply line 20.

The selection transistor Tr1 and the element driving transistor Tr2 can be formed using an n-channel thin film transistor or a p-channel thin film transistor in which a crystalline silicon such as, for example, polycrystalline silicon polycrystallized by laser annealing or the like is used in an active layer and an n-type conductive impurity or a p-type conductive impurity is doped as the impurity.

When a thin film transistor having crystalline silicon in the active layer is employed as the transistor of the pixel circuit, the crystalline silicon thin film transistor can be used as a circuit element in a peripheral driver circuit for sequentially selecting and controlling each pixel, in addition to being used as a circuit element in the pixel circuit. In consideration of this, in the organic EL display panel 10 of the present embodiment, a crystalline silicon thin film transistor similar to that in the pixel circuit is formed on the panel substrate 12 simultaneously with the manufacturing of the transistors for the pixel circuit so that the peripheral driver circuit, more specifically, an H-related driver 22 and a V-related driver 24, is built into the peripheral portion of the display region 14. As shown in FIG. 3, the H-related driver 22 is formed adjacent to the upper side of the display region 14 and along the horizontal scan direction. Similarly, the V-related driver 24 is placed, in the structure of FIG. 3, adjacent to the right side of the display region 14 and along the vertical scan direction.

A drive current line (common line) 27 for supplying the driving power (PVDD) to the EL element of each pixel via each power supply line PL is formed along the horizontal direction common to a plurality of power supply lines PL in a region 26 adjacent to the lower side of the display region 14 which opposes the side of the display region 14 on which the H-related driver 22 is formed. A plurality of connection terminals 36 (external connection terminals) for supplying various power supplies and V-related and H-related control and data signals to the panel 10 from the outside are formed on the left side which is a first side of the panel substrate 12 along the vertical scan direction. A flexible printed circuit (hereinafter referred to as "FPC") 28 is connected to the external connection terminal 36. Therefore, the V-related driver 24 is placed on a side of the display panel which opposes, with the display region 14 therebetween, the side of the display panel on which the external connection terminal 36 is placed. The H-related driver 22 is placed on one of the two sides (in FIG. 3, the upper side) connecting the side of the display panel on which the external connection terminal 36 is placed and the side which opposes this side. As is explicitly shown in FIG. 3, the connection position between the FPC 28 and the external connection line (position in which the external connection terminal is provided) is at a position which is lower than the center of the display panel or the display region along the vertical scan direction.

The lines from the external connection terminal 36 to the H-related driver 22 and the V-related driver 22 and the line from the external connection terminal 36 to the drive current common line 27 extend in a region between the left side of the panel substrate 12 on which the external connection terminal is formed and the left side of the display region 14. Similar to these lines, an H-related level shifter (H-related LS) 30 (refer to FIG. 4) is placed on the left side of the panel substrate 12, which shifts one or both of voltage levels of a higher voltage and a lower voltage in order to set the levels of necessary signals, among the signals supplied to the H-related driver such as horizontal clock signals SKH1 and SKH2, a horizontal start signal STH, and Hout for instructing completion of final operation of the H-related driver and shift direction, to levels suitable for operations by the H-related driver 22. In addition, a V-related level shifter (LS) 32 is provided on an upper right corner of the display region 14 (on an input side of signal for V-related driver 24). In the example configuration of FIG. 4, the V-related LS 32 shifts the lower voltage power supply VSS to a power supply voltage VEE which is lower than the lower voltage VSS and supplies the shifted voltage to the V-related driver 24 which creates and outputs a selection signal, in order to sufficiently reduce the L level of the selection signal to be output for each row of pixels of the display region 14. A contact region (point) 34 between a common electrode of the EL elements 55 of the pixels (in this description, cathode) and a common electrode line 64 extending from the external connection terminal corresponding to the common electrode is placed along the vertical scan direction next to the left side of the display region 14 on the first side.

Figure 4:
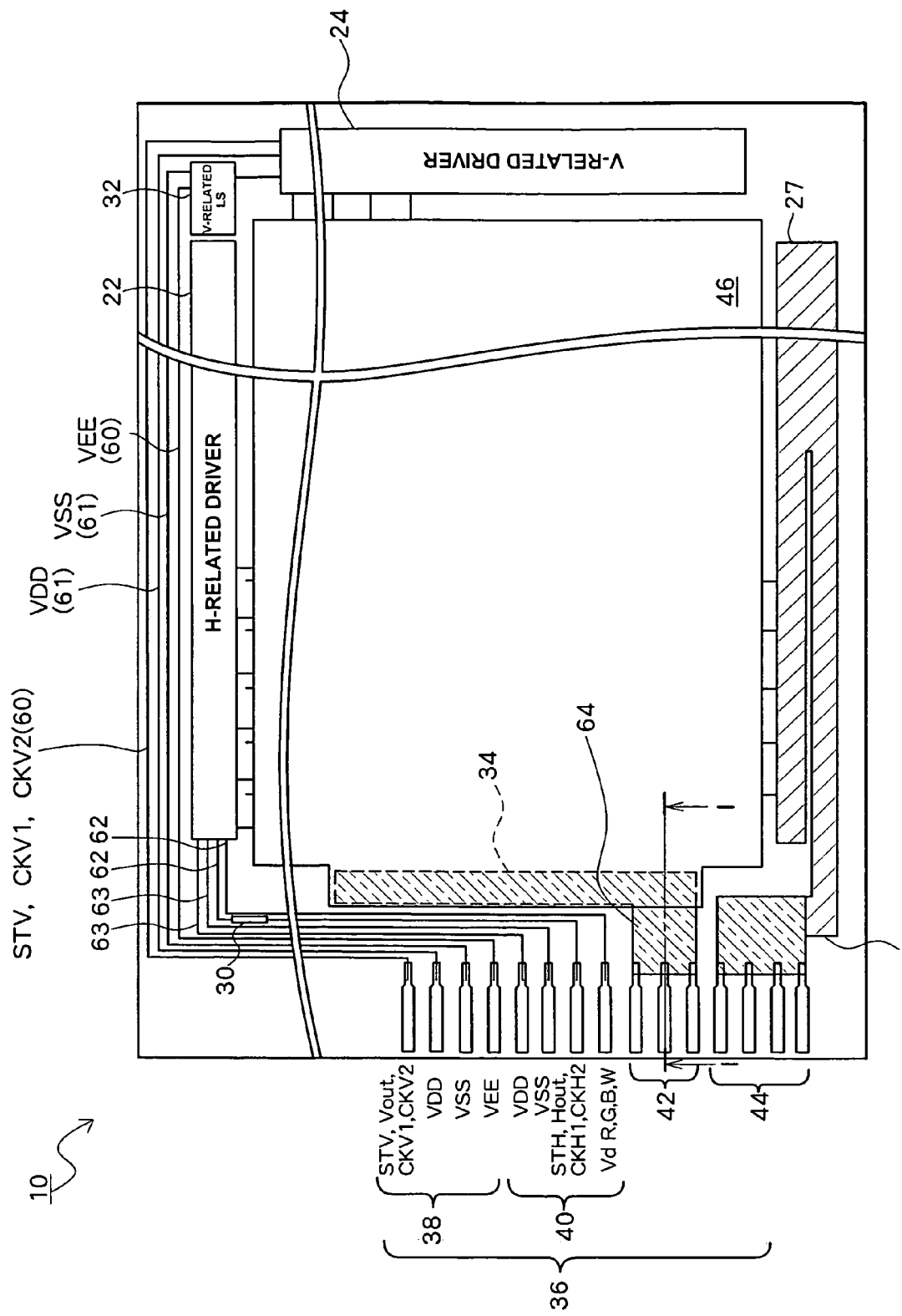
FIG. 4 is a diagram showing a placement of a terminal, a line, a circuit, or the like in an EL display panel according to a preferred embodiment of the present invention.

FIG. 4 is a diagram showing the lines extending from the external connection terminal 36 connected to the FPC 28 to the H-related driver 22, V-related driver 24, drive current common line 27, and point 34 for cathode power supply. The external connection terminals 36 formed on the panel substrate 12 include a V-related terminal 38, an H-related terminal 40, a CV terminal 42, and a terminal 44 for drive power supply (PVDD), formed in this order along the vertical scan direction from the upper side. The V-related terminal 38 is connected to vertical scan-related lines 60 and 61 for the V-related driver 24, the H-related terminal 40 is connected to horizontal scan-related lines 62 and 63 for the H-related driver 22, the CV terminal 42 is connected to a common electrode line 64 connecting the cathode 46 of the EL elements which is formed common to the pixels and the cathode power supply, and the PVDD terminal 44 is connected to the drive current common line 27 for supplying the drive current to the EL element in each pixel. The lines 60 and 61 related to the V-related driver 24 placed on the right side which opposes the left side on which the external connection terminals 36 are placed is placed to detour around the external sides of the H-related driver 22 at the upper side.

Of the vertical scan-related lines 60 and 61, two lines 61 are power supply lines for the V-related driver 24 (hereinafter referred to as "V-related power supply line 61"). One of the two V-related power supply lines 61 is a line for a higher voltage power supply VDD and the other is a line for a lower voltage power supply VSS. Of the horizontal scan-related lines 62 and 63, two lines 63 are power supply lines for the H-related driver 22 (hereinafter referred to as "H-related power supply line 63"). Similar to the V-related power supply lines, one of the H-related power supply lines 63 is a line for a higher voltage power supply VDD and the other is a line for a lower voltage power supply VSS. The V-related power supply line 61 further extends on the left side on which the external connection terminals 36 are placed, in the upward direction, reaches the upper side, extends on the upper side toward the right along the horizontal scan direction, reaches the right side, and extends on the right side in the downward direction along the vertical scan direction. The V-related driver 24 shown by a rectangle in the figure actually includes circuit elements which form circuits, such as the shift register and the selection signal output circuit, for outputting a selection signal for driving the pixels for each row to the gate line GL. The V-related power supply lines 61 are provided through the illustrated rectangular region, in order to supply power to these circuit elements.

The H-related power supply line 63 extends from the left side on which the external connection terminal 36 is placed in a upward direction along the vertical scan direction, bends near a region in which the H-related driver 22 is formed toward the horizontal scan direction, and extends toward the right. The H-related driver 22 shown in the figure by a rectangle include circuit elements which form circuits, such as the shift register and a video signal outputting circuit, for outputting, at a predetermined timing, a video signal Vd for, for example, R, G, B, and W to the data line DL extending along the column direction in the display region 14 and connected to the corresponding pixel. The H-related power supply line 63 is provided through the illustrated rectangular region in order to supply power to individual circuit element.

In the present embodiment, the V-related power supply lines 61 and the H-related power supply lines 63 are provided along the left side, right side, and upper side of the display panel 10, and are not provided on the lower side. As only the drive current common line 27 is placed on the lower side, it is possible to set the widths of the upper and lower frames to be close to each other even when a sufficient width is secured for the drive current common line 27. Because the brightness of a pixel is determined corresponding to the current flowing through the EL element in an organic EL display device, the line load of the drive current common line 27 which supplies power to the EL element influences the display quality. In order to secure sufficient brightness and inhibit power consumption, it is desirable that the line load of the drive current common line 27, in particular, the line resistance of the drive current common line 27 be low. Therefore, a layout of the present embodiment which allows a wider width for the line 27 is preferable.

In the present embodiment, by placing, among the external connection terminals 36, the V-related terminal 38 at an upper side of the screen along the vertical scan direction among the terminals, it is possible to reduce the length of the line to the V-related driver 24 at the opposing side and to avoid crossing with other lines, in particular, the line to the H-related driver 22.

The V-related terminal 40 is placed next to the V-related terminal 38, that is, adjacent to the V-related terminal 38 nearer to the center of the screen. By locating the H-related terminal 40 in this manner, it is possible to shorten the length of the line from the H-related terminal 40 to the H-related driver 22 placed on the upper side of the display panel.

In the present embodiment, the PVDD terminal 44 for the pixel driving power supply, that is, the driving power supply of the EL element, is provided at a lowermost position of the screen along the vertical scan direction among the terminals. With this structure, it is possible to shorten the length of the line 66 to the drive current line 27 placed on the lower side of the display panel. In the lines 27 and 66, because the drive current flows through these lines, a voltage drop due to line resistance tends to occur when the line is long. Such a voltage drop would reduce an amount of current that can be supplied to the EL element of each pixel, which results in reduction of the brightness of the panel. The reduction in the brightness leads to degradation of the display quality. If the brightness is to be secured, the power consumption is increased. Thus, it is preferable to minimize the voltage drop in the lines 27 and 66 through which the drive current flows. By placing the PVDD terminal 44 at a lowermost position among the terminals, that is, at a position closest to the drive current line 66 among the terminals, it is possible to shorten the length of the line 66, in particular, and inhibit voltage drop. Moreover, in addition to the PVDD terminal 44 being provided at the lowermost position among the terminals, it is also preferable that the PVDD terminal 44 be placed at the lowest possible position with respect to the display region 14, that is, at a position closest to the lower side. For this purpose, it is preferable to place the PVDD terminal 44 at a position lower than a center position of the display region 14 along the vertical scan direction (refer to a center line 50 extending along the horizontal direction in FIG. 3). It is also preferable to employ a layout in which a center line 48 of the external connection terminals 36 (refer to FIG. 3) is positioned lower than the center line 50 of the display region. Because the voltage drop in the lines 27 and 66 through which the drive current flows greatly influences reduction of display quality, it is desirable to shorten the length of the line 66 through which the drive current flows, even if such a configuration results in a slight elongation of the lines for the H-related driver 22 and the V-related driver 24. For this purpose, it is preferable that the external connection terminals be placed at the lowest possible position on the first side of the display panel, as described above. The CV terminal 42 is provided between the H-related terminal 40 and the PVDD terminal 44.

From a different point of view, the CV terminal 42 for connecting an external cathode power supply to a connection point 34 for cathode power supply placed on the left side which is the side closest to the external connection terminal 36 is placed at an inner position and the H-related terminal 40 for the H-related driver 22 placed on the upper side and the PVDD terminal 44 for the drive current line 27 placed on the lower side are placed on both sides of the CV terminal 42. In addition, the V-related terminal 38 for the V-related driver placed on the side opposing the left side on which the external connection terminal 36 is placed, that is, the right side which is the farthest side from the left side is placed at an outer position than the H-related terminal 40 and the PVDD terminal 44. There is a demand for widening the drive current line 27 as much as possible in order to reduce the line load, and, thus, the line to the V-related driver 24 is preferably placed on the upper side. Because of this structure, the V-related terminal 38 is placed external to the H-related terminal 40, among the H-related terminal 40 and the PVDD terminal 44, that is, at a position of the display region 14 higher than the H-related terminal 40.

Figure 5:
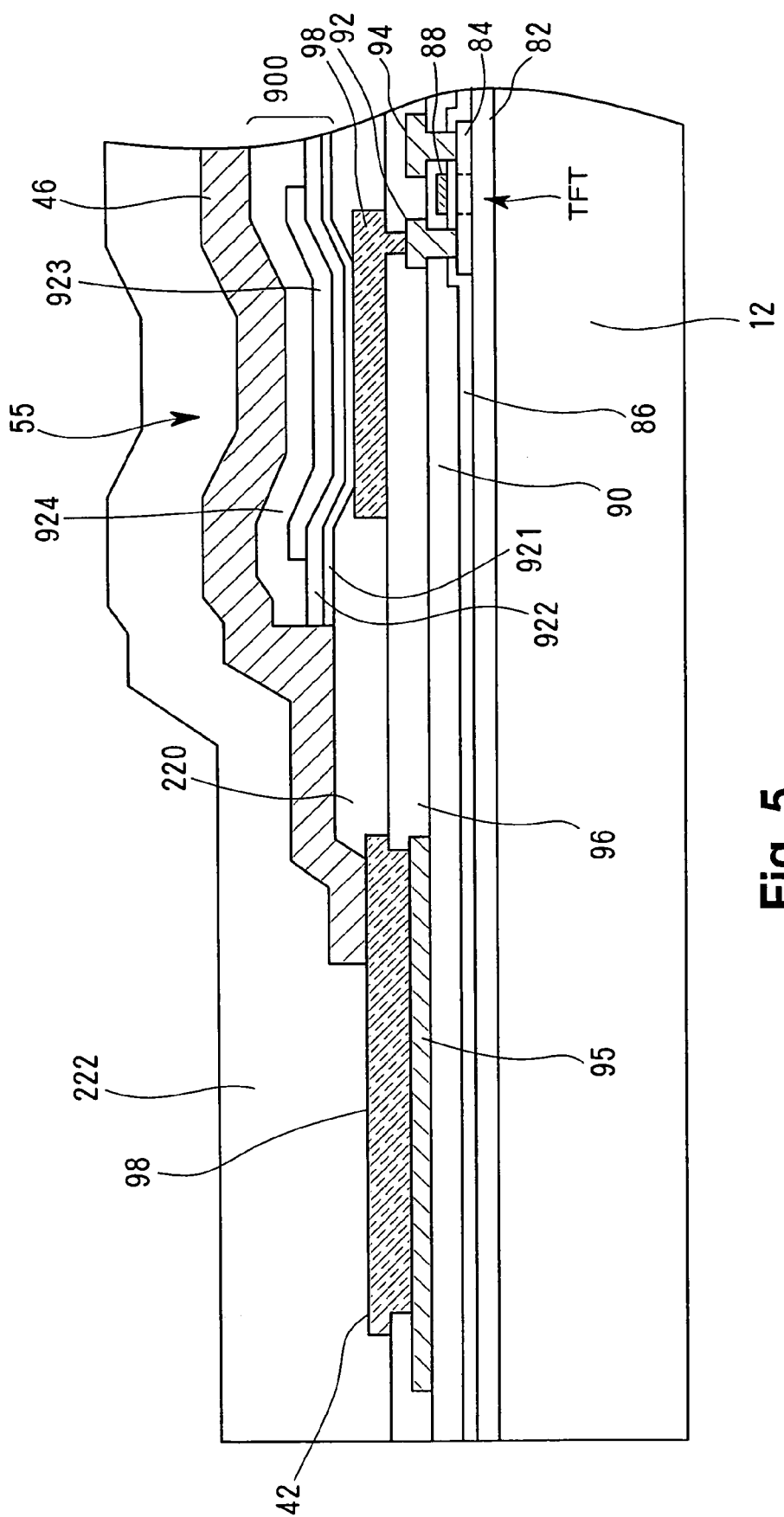
FIG. 5 is a cross sectional view along the I-I line of FIG. 4.

FIG. 5 is a cross sectional diagram along I-I line of FIG. 4 and shows a cross section around the line 64 from the CV terminal 42 to the cathode 46.

A buffer layer 82 having a multi-layer structure in which, for example, a silicon nitride (SiN) film and a silicon oxide ($SiO_2$) film are formed in this order from the side near the panel is formed, by a chemical vapor deposition (CVD) or the like, on the panel substrate 12 made of a transparent material such as glass and plastic. A crystalline silicon layer of polycrystalline silicon or the like obtained by applying a process such as laser annealing to amorphous silicon formed through CVD or the like is formed above the buffer layer 82. The crystalline silicon layer is patterned in a desired shape and is used as an active layer 84 of a thin film transistor (TFT) or a portion of an electrode and the line as necessary.

After the crystalline silicon layer is patterned, a gate insulating layer 86 is formed entirely covering the substrate including the crystalline silicon layer. The gate insulating layer 86 has a multi-layer structure, for example, in which a $SiO_2$ film and a SiN film are layered from the side near the crystalline silicon layer. A refractory metal layer of a metal such as Cr is formed above the gate insulating layer 86 and the metal layer is patterned so that a portion of the metal layer selectively remains in a formation region of the thin film transistor, that is, a formation region of the active layer 84, in regions in which the channel region is to be formed and a gate electrode 88 is obtained. The metal layer can also be used as the selection line (gate line) for supplying the selection signal to each pixel. By selectively leaving the metal layer simultaneously with formation of the gate electrode 88 of the thin film transistor, this line can be obtained. After the gate electrode 88 is formed, an impurity such as phosphorous and boron is doped into the active layer 84 according to the conductive type of the thin film transistor using the gate electrode 88 as a mask. A region of the active layer 84 below the gate electrode is not doped with impurity and an intrinsic channel region is formed. Regions on both sides of the channel region are doped with the impurity and a drain region and a source region are formed.

After the impurity is doped, an interlayer insulating layer 90 is formed over the entire surface of the panel substrate 12 covering the gate insulating layer 86 and the gate electrode 88. The interlayer insulating layer 90 has a multi-layer structure in which, for example, a SiN film and a $SiO_2$ film are layered in this order from the side near the gate insulating layer 86.

A contact hole is formed through the interlayer insulating layer 90 and the gate insulating layer 86 to expose the source region and the drain region of the active layer 84. A drain electrode 92 and a source electrode 94 which are formed above the interlayer insulating layer 90 are connected through the contact holes to the corresponding drain region and the corresponding source region of the active layer 84, respectively. The drain electrode 92 and the source electrode 94 are formed by layering Mo (molybdenum), Al (aluminum), and Mo in that order from the lower layer. The first Mo layer is in contact with the active layer 84. This metal layer of Mo/Al/Mo is used also for the other lines and is obtained by formation and patterning simultaneous with formation of the drain electrode 92 and the source electrode 94. For example, the metal layer is used as a data line DL for supplying the data signal to each pixel (not shown) and as the power supply line PL for supplying the current from the power supply PVDD to the organic EL element. In addition, as shown at the left end of FIG. 5, the metal layer is also used as a metal terminal layer 95 for connecting the panel and the external circuit (CV terminal 42 is shown in FIG. 5) and is patterned to a shape of the terminal.

After the metal layer having a layered structure is patterned to form the drain electrode 92, source electrode 94, lines (DL and PL), and metal terminal layer 95, a first planarizing insulating layer 96 is formed over the entire surface of the panel substrate 12 covering the metal layer and the interlayer insulating layer 90 using an organic insulating material such as an acrylic resin or other inorganic materials, through, for example, spin coating or calcination after the spin coating.

Contact holes are formed through the first planarizing insulating layer 96 in regions corresponding to, for example, the drain electrode 92 (or source electrode 94) and the region in which the terminal is formed. Then, a conductive transparent metal oxide layer such as ITO (Indium Tin Oxide) and IZO (Indium Zinc Oxide) is formed through sputtering or the like above the first planarizing insulating layer 96 and is patterned into a desired shape. In the region corresponding to the drain electrode 92 (or source electrode 94), the transparent conductive metal oxide layer is used as a transparent pixel electrode 98 and is connected to the drain electrode 92 (or source electrode 94) through the contact hole formed through the first planarizing insulating layer 96. In the present embodiment, the transparent pixel electrode 98 is used as a first electrode (anode) 98 of the organic EL element 55. Simultaneously with the formation of the transparent pixel electrode 98, the transparent conductive metal oxide layer is selectively left above the metal terminal layer 95 having the structure of Mo/Al/Mo exposed by removing the first planarizing insulating layer 96 in the region of formation of the terminal. As described, for the electrical characteristic of the terminal, it is sufficient to use the metal terminal layer 95 having a layered structure including Al. However, by employing a structure in which the surface of the metal terminal layer 95 is covered with a conductive metal oxide layer, it is possible in the present embodiment to prevent exposure of the surface of the metal terminal 95 to the external atmosphere and subsequent increase in the connection resistance due to oxidation of the surface by the oxygen, moisture, etc. in the atmosphere.

By covering, with the conductive metal oxide layer, the line region extending from the terminal as necessary, in addition to the terminal portion, it is possible to prevent intrusion of oxygen and moisture in the atmosphere through the line (for example, while continuing to oxidize the surface of the line) into the display region in which the organic EL element 55 is formed and which is sealed by adhering a sealing panel in a later step.

Next, a second planarizing insulating layer 220 is formed using an acrylic resin or the like similar to the first planarizing insulating layer 96 covering entirely the panel substrate 12. An opening is formed in the second planarizing insulating layer 220 in portions other than the terminal portion and the edge portion of the conductive transparent metal oxide layer of the first electrode of the pixel. After the second planarizing insulating layer 220 is formed and the opening is formed, a light emitting element layer 900 is formed in the display region. In the region of formation of the first electrode 98, the edge portion is covered by the second planarizing insulating layer 220. The edge portion is covered in order to prevent the first electrode 98 and a second electrode 46 of the organic EL element 55 from short-circuiting in the edge portion due to reduction in coverage of the light emitting element layer 900 formed between the first electrode 98 and the second electrode 46 or due to concentration of electric field.

The light emitting element layer 900 comprises at least a light emitting layer including an organic compound having a light emitting function, and may be of a single-layer structure or a multi-layer structure depending on the functions of the compound or compounds used. In a structure of the first electrode 98 being the anode and the second electrode 46 being the cathode as in the present embodiment, the light emitting element layer 900 may have a layered structure of, for example, a hole injection layer 921, a hole transport layer 922, a light emitting layer 923, and an electron transport layer 924, formed, in that order, from the side of the first electrode. The layers of the light emitting element layer 92 may be formed through vacuum evaporation when a low molecular weight organic compound is used as the material. When a high molecular weight (a polymer) organic compound is used as the material, on the other hand, it is also possible to form the layers of the light emitting element layer 92 through ink jet printing or spin coating.

The layers other than the light emitting layer such as the charge transport layer and the injection layer can be formed common to all pixels (each of these layers may be formed in some cases in an individual pattern for each pixel depending on the material to be used). When a full-color display is realized by employing white color as the light emission color of the EL element in each pixel and using color filters to obtain light of R, G, and B, the light emitting layer of the organic EL element need not be formed in an individual pattern using a mask even when the light emitting layer is formed through vacuum evaporation, and, in such a case, the light emitting layer may be formed common to all pixels, similar to the other organic layers. When the EL element of each pixel emits corresponding light of R, G, and B, different organic light emitting materials must be used for different light emission colors, and, thus, at least the light emitting layer is formed in an individual pattern for each pixel.

A second electrode 46 in which Al, an Al alloy, MgAg alloy, or the like is used is formed above the light emitting element layer 900 covering the light emitting element layer 900 through vacuum evaporation or the like. As described, in the present embodiment, the second electrode 46 functions as the cathode (cathode electrode) The cathode electrode 46 is connected to a line 64 extending from the CV terminal at an end of the horizontal scan direction of the display region 14, that is, at the left side in the present embodiment. When at least an upper layer of the line 64 is formed using the transparent conductive metal oxide layer which is the same layer as the transparent pixel electrode 98 as described above, the connection between the line 64 and the cathode electrode 46 is achieved by directly forming the cathode electrode 46 above the transparent conductive metal oxide layer 64 exposed at the uppermost layer because the second planarizing insulating layer 220 is normally removed outside the display region and the light emitting element layer 900 is not layered. When the transparent conductive metal oxide layer is not used as the upper layer of the line 64 at the connection portion between the cathode electrode 46 and the line 64 and only the Mo/Al/Mo metal layer is formed, an opening is formed in the interlayer insulating layer 90 and the first planarizing insulating layer 96 and the cathode electrode 46 is layered to cover the Mo/Al/Mo metal layer exposed at the bottom of the opening and is electrically connected. Above the cathode electrode 46 which is formed over the entire surface, a protection layer 222 such as a SiN layer is formed through sputtering or the like to cover the entire surface of the substrate.

As described, according to the present embodiment, because the PVDD terminal 44 is placed at a position lower than a center position of the display region 14 in the vertical scan direction (center line extending along the horizontal direction), the line 66 through which the drive current flows is shortened and the line resistance is reduced, and, thus, reduction in the display quality due to reduction in brightness can be prevented and increase in the power consumption can be prevented. In addition, by placing the lines 60 and 61 for the V-related driver 24 at the upper side of the display panel 12, it is possible to set the widths of the frame portions, which are regions between the edge of the display region 14 and the edge of the panel substrate 12, at the upper section and the lower section to be close to each other while allowing sufficient width for the drive current line 27. In other words, it is possible to match the Y address of the center of the display and the Y address of the center of the external shape of the panel substrate, which allows improvement in degree of freedom of attachment to various devices. The V-related driver 24 may be placed on the left side. However, such a configuration results in generation of a parasitic capacitance between the V-related driver 24 and the cathode 46, which may lead to an increase in the power consumption. In addition, it is necessary to seal the surface on which the organic EL element is formed also in the right side, and, thus, the space for adhesion of the sealing member is also provided at the right side. Therefore, placing the V-related driver 24 at the right side enables more effective use of the available space.

With the above-described placement, it is possible to place the circuits and lines with a superior balance in the frame space which is necessary for sealing, which enables effective use of the panel substrate, improvement in display quality, reduction in power consumption, and reduced costs.

Figure 6:
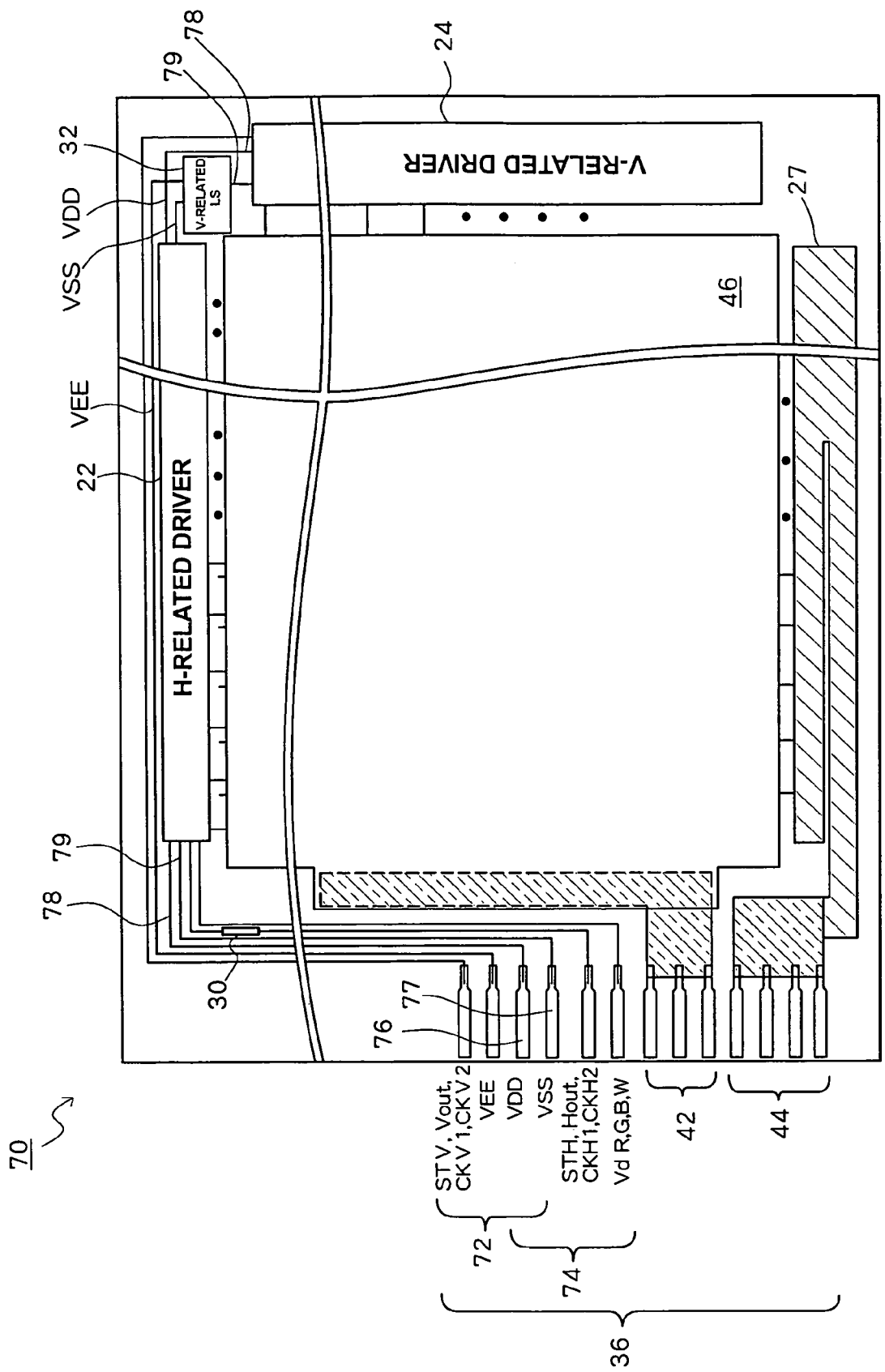
FIG. 6 is a diagram showing a placement of a terminal, a line, a circuit, or the like in an EL display panel according to another preferred embodiment of the present invention.

FIG. 6 is a diagram showing extension of lines (line layout) in an organic EL display panel 70 according to another preferred embodiment of the present invention. The circuit structure and layout in the display region are similar to those of FIG. 3 and the common structures will not be described again. Similarly, the structures similar to those in the organic EL display panel 10 of FIG. 4 are assigned the same reference numerals and will not be described again. In the organic EL display panel 70 of FIG. 6, the power supply line is formed common to the H-related and V-related drivers.

A plurality of external connection terminals 72 related to the V-related driver 24 and a plurality of external connection terminals 74 related to the H-related driver 22 share the terminals 76 and 77 related to power supply of these drivers. An H-related level shifter 30 is provided on the power supply lines 78 and 79 extending from the common terminals 76 and 77 to the H-related driver 22. The line 78 for a higher voltage power supply and the line 79 for a lower voltage power supply which supply an operational power to the H-related driver 22 extend from the region of formation of the H-related driver 22 along the horizontal scan direction toward the right, bend at the upper right corner of the panel to a downward direction along the vertical scan direction, reach the V-related driver 24, and supply the operational power also to the V-related driver 22. Similar to FIG. 4, etc., a V-related level shifter 32 is provided upstream of the V-related driver 24 and the voltage VSS on the line for the lower voltage power supply is shifted to a power supply voltage VEE which is lower than VSS.

The lines 78 for the higher voltage power supply and the lines 79 for the lower voltage power supply of the H-related driver 22 and the V-related driver 22 and the external connection terminals 76 and 77 to which the power supply lines are connected are shared by the two drivers. In other words, the line 78 for the higher voltage power supply for the V-related driver 24 is connected to the external connection terminal 76 via the line 78 for the higher voltage power supply for the H-related driver 22, and the lines 78 for the higher voltage power supply for the drivers are connected in series. Similarly, the line 79 for the lower voltage power supply for the V-related driver 24 is connected to the external connection terminal 77 via the line 79 for the lower voltage power supply for the H-related driver 22 and the lines 79 for the lower voltage power supply for the drivers are connected in series. As described, because the H-related driver 22 and the V-related driver 24 share the power supply lines and the external connection terminals, it is not necessary to provide terminals and lines for the same voltage for the two drivers, and, thus, the number of external connection terminals and the number of power supply lines can be reduced, which allows for reduction of the terminal provision space and the line provision space.

In addition, in the EL display panel 70, the power supply lines for the drivers extend from the left side, on which the external connection terminals are formed, in an upward direction, pass through the upper side to reach the right side, and extend in a downward direction on the right side. As is clear from a comparison with FIG. 4, the number of lines to be provided on the upper side of the panel separate from the lines for the H-related driver 22 can be reduced, which simplifies balancing of the width of the frame portion with the lower side. With this structure, the center of the vertical direction of the display region and the center of the external shape of the panel substrate, that is, the display device, match or becomes very close to each other. Therefore, the degree of freedom of the layout when the panel is assembled into an apparatus as its display device can be improved and the marketability as a panel can be improved. In addition, the outer size of the panel substrate is reduced, which contributes to reductions in size and cost. Similar to the device of FIG. 4, it is not necessary to place the power supply lines for the H-related driver and V-related driver on the lower side of the panel, and the power supply lines are not placed on the lower side. Therefore, the space for placing the element drive current common line 27 for supplying drive current to the EL element (here, anode of the EL element) via the power supply line VL (refer to FIG. 3) can be maximized at the lower side of the panel (side opposing the side on which the H-related driver 22 is placed).

Figure 7:
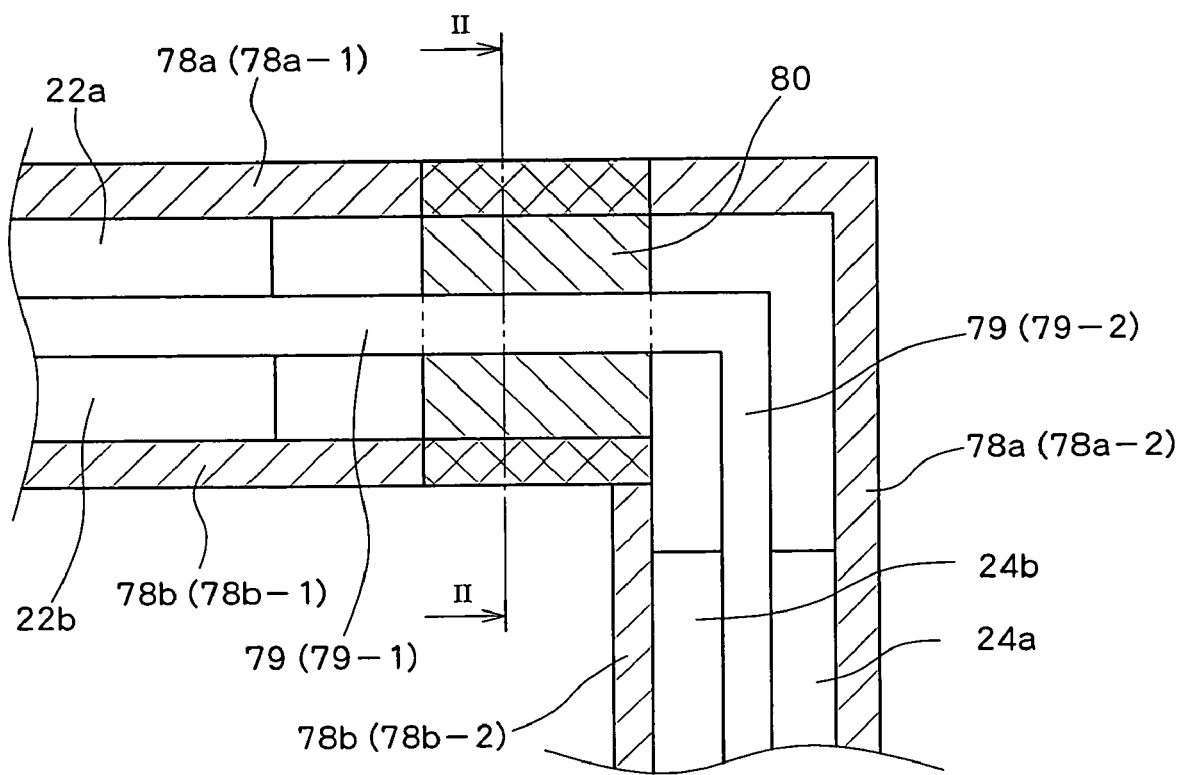
FIG. 7 is a diagram showing an alternative embodiment of a line of the preferred embodiment of FIG. 6.

FIG. 7 is a diagram exemplifying a layout of power supply lines when the power supply lines for the H-related driver and the power supply lines for the V-related driver are connected in series so that the lines are common to the drivers. In particular, FIG. 7 shows a layout of a region corresponding to the upper right corner of FIG. 6, between the end portion of the H-related driver 22 and the beginning portion of the V-related driver. In the structure exemplified in FIG. 7, one of the line 78 for the higher voltage power supply (VDD) and the line 79 for the lower voltage power supply (VSS) is formed in a plurality. Although it is also possible to provide a plurality of lines 78 for the higher voltage power supply and a plurality of lines 79 for the lower voltage power supply, in the structure of FIG. 7, a plurality of lines 78 for the higher voltage power supply in which voltage drop tends to occur (in the exemplified structure, two lines: 79*a* and 78*b*) are provided sandwiching the line 79 for the lower voltage power supply therebetween. In a region of the power supply line for the H-related driver 22 and a region of the power supply line for the V-related driver, the line widths of the power supply lines are changed. More specifically, the line width of the power supply line for the H-related driver 22 having a shorter line distance to the eternal connection terminal is formed wider than the line width of the power supply line for the V-related driver 24 having a longer line distance. In addition, the line width is changed with the upper right corner of the panel (a region between the H-related driver 22 and the V-related driver 24) as a boundary. In other words, in the line 78*a* for the higher voltage power supply, the width of the line 78*a*-1 provided at the upper side of the panel and nearer to the external connection terminal 36 has a wider width and the line 78*a*-2 for the higher voltage power supply extending toward the right side of the panel has a narrower width. Similarly, the line 78*b*-1 for the higher voltage power supply and the line 79-1 for the lower voltage power supply formed on the upper side of the panel have wider widths and the corresponding lines 78*b*-2 and 79-2 formed on the right side of the panel have narrower widths. In this manner, by setting the width of the power supply line of the driver having the shorter line distance from the external connection terminal to be wider than the line width of the power supply line for the driver having a longer line distance, it is possible to inhibit voltage drop in the driver having a shorter line distance and reduce the power consumption. In particular, as described in the present embodiment, the H-related driver 22 must output a data signal to all data lines in each 1H period and must be operated at a higher speed compared to the V-related driver 24. Thus, the H-related driver 22 is formed nearer to the external connection terminal 36 than is the V-related driver 24. In addition, the power supply lines 78 and 79 are shared by the two drivers. Therefore, it is possible to inhibit voltage drop or the like in the H-related driver by widening the line width of the power supply line in the region of the H-related driver.

In FIG. 7, in the region of formation of the H-related driver 22, an H-related shift register circuit 22*a* is placed between the line 78*a*-1 for the higher voltage power supply and the line 79-1 for the lower voltage power supply. In addition, an H switch circuit 22b or the like is provided between the line 79-1 for the lower voltage power supply and the line 78b-1 for the higher voltage power supply.

As the H-related shift register circuit 22a, a plurality of shift registers are placed along the horizontal scan direction, and the register of each stage sequentially transfers a horizontal start signal STH to the right along the horizontal scan direction according to horizontal clock signals SKH1 and SKH2. The H switch circuit 22b is connected to an output terminal of the register of a corresponding stage and connects the data line DL of a corresponding column to a video signal line according to an output from the register. In other words, the H switch circuit operates according to the output signal from the register to read and output a corresponding video signal Vd to the corresponding data line DL.

In a region of formation of the V-related driver 24, a V-related shift register circuit 24a is placed between the line 78a-2 for the higher voltage power supply and the line 79-2 for the lower voltage power supply and a selection signal outputting section 24b comprising a logical circuit or the like which adjusts and outputs a selection signal for switching the selection transistor of the pixel ON at a predetermined timing for each row according to an output from the V-related shift register circuit 24a is provided between the line 79-2 for the lower voltage power supply and the line 78b-2 for the higher voltage power supply. As the V-related shift register circuit 24a, a plurality of shift registers is placed along the vertical scan direction. A register of each stage sequentially transfers a vertical start signal STV in a downward direction along the vertical scan direction according to vertical clock signals SKV1 and SKV2 and supplies the register output which is a pulse signal to a corresponding selection signal outputting section 24b.

With respect to the H-related shift register 22a and the V-related shift register 24a which are placed at an outer position on the panel than the line 79 for the lower voltage power supply, a higher voltage power supply is supplied from the line 78a on the side near the outer periphery of the panel. With respect to the H switch circuit 22b and the selection signal outputting section 24b which are placed at an inner position on the panel than the line 79 for lower voltage power supply, the higher voltage power supply is supplied from the line 78b which is at an internal position on the panel. In other words, in the example structure of FIG. 7, lines 78a and 78b for the higher voltage power supply are independently provided for the shift registers (22a and 24a) and the H switch circuit or the selection signal outputting section (22b, 24b) which are circuits having different processes. Because of this structure, the higher voltage power supply 78 can be reliably supplied to the circuits having different processes, thus making it possible to inhibit increase in the power consumption due to voltage drop, and, consequently, to improve the precision of the circuit operation. In addition, the circuits which directly output various signals to the display region (H switch circuit 22b and selection signal outputting section 24b) are formed at positions nearer to the display region than is the shift register and the higher voltage power supply is independently supplied to each circuit. Therefore, it is possible to realize a very high layout efficiency.

In this alternative embedment, as shown in FIG. 7, a bypass line (bridge line) 80 is formed for connecting the lines 78a-1 and 78a-2 for the higher voltage power supply which are provided in plurality, in an end portion of the H-related driver 22. An area A of FIG. 8 shows a cross section near the bridge line 80 (II-II cross section).

Figure 8:
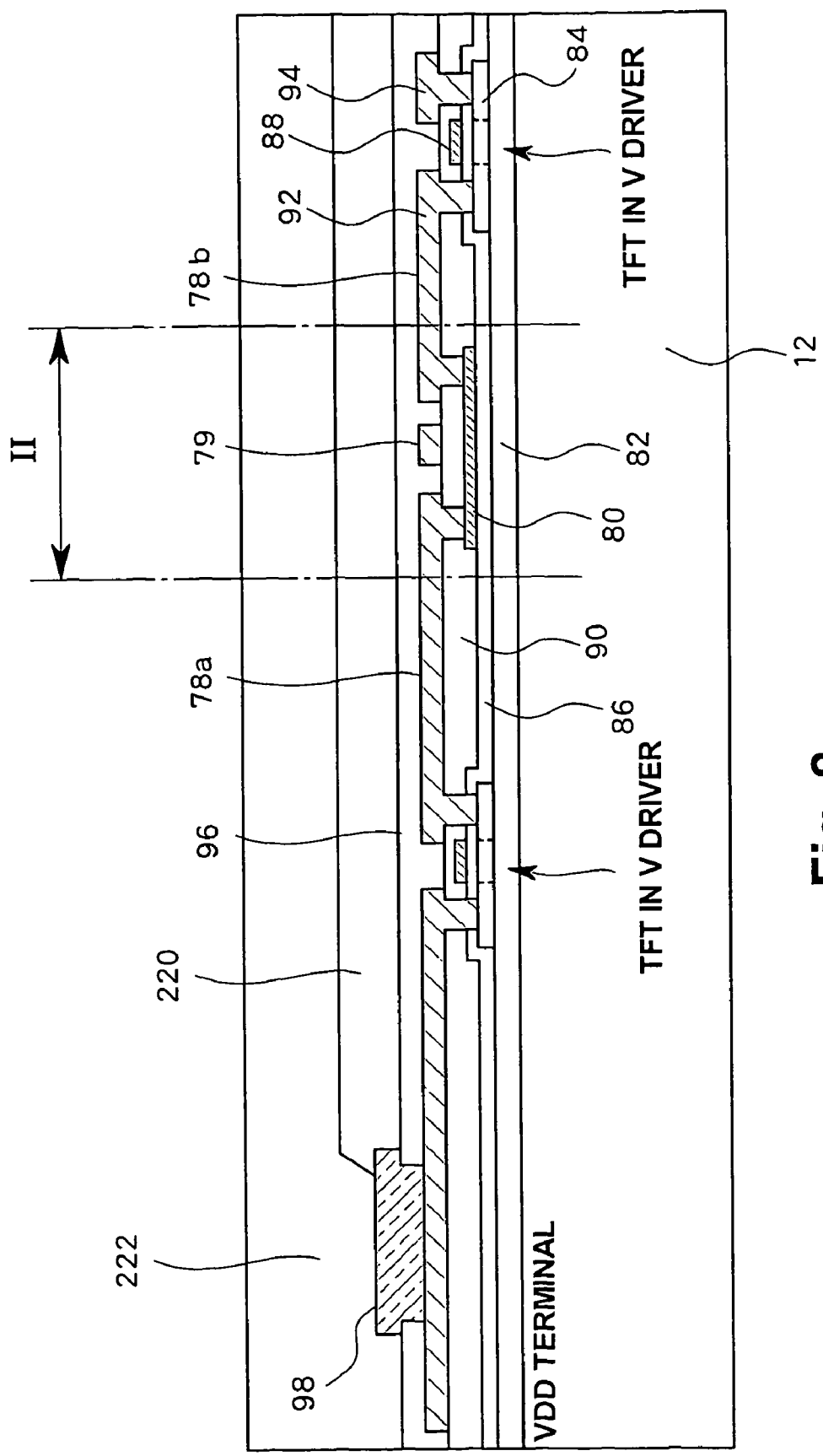
FIG. 8 is a diagram diagrammatically showing a cross section of the alternative embodiment of FIG. 7.

FIG. 8 diagrammatically shows a cross section of the organic EL display panel and particularly shows a relationship between the bridge line 80 and the other circuit elements and lines. In FIG. 8, structures identical to those in FIG. 5 are assigned the same reference numerals and their description will not be repeated.

In FIG. 8, the TFT in the H driver and the TFT in the V driver have a structure similar to the TFT of the display region shown in FIG. 5, and a crystalline silicon layer such as polycrystalline silicon obtained by applying a process such as laser annealing to the amorphous silicon which is formed in advance above the buffer layer 82 of the panel substrate 12 which is made of a transparent material such as glass or plastic is used as the active layer of the TFT.

In a desired region above the gate insulating layer 86 formed covering the active layer 84, a refractory metal layer such as Cr is patterned to form the gate electrode 88. In the patterning process for obtaining the gate electrode 88, the bridge line 80 is also obtained. Therefore, the bridge line 80 is formed using a metal layer such as Cr. The metal layer may be used, in addition for the bridge line 80, for a selection line (gate line) for supplying the selection signal to each pixel as described above. This line can be formed by selectively leaving the metal layer simultaneously with the formation of the gate electrode 88 of the thin film transistor.

The drain electrode 92 and the source electrode 94 are formed using a layered metal layer of Mo/Al/Mo. The layered metal layer is used as the lines other than the drain electrode 92 and the source electrode 94. For example, the power supply lines 78a, 78b, and 79 are formed and patterned simultaneously with the drain electrode 92 and the source electrode 94. A contact hole is formed in a portion of the interlayer insulating layer 90 corresponding to an end of the bridge line 80 prior to the formation of the metal layer and a predetermined portion of the metal layer and the bridge line 80 are connected.

Figure 9:
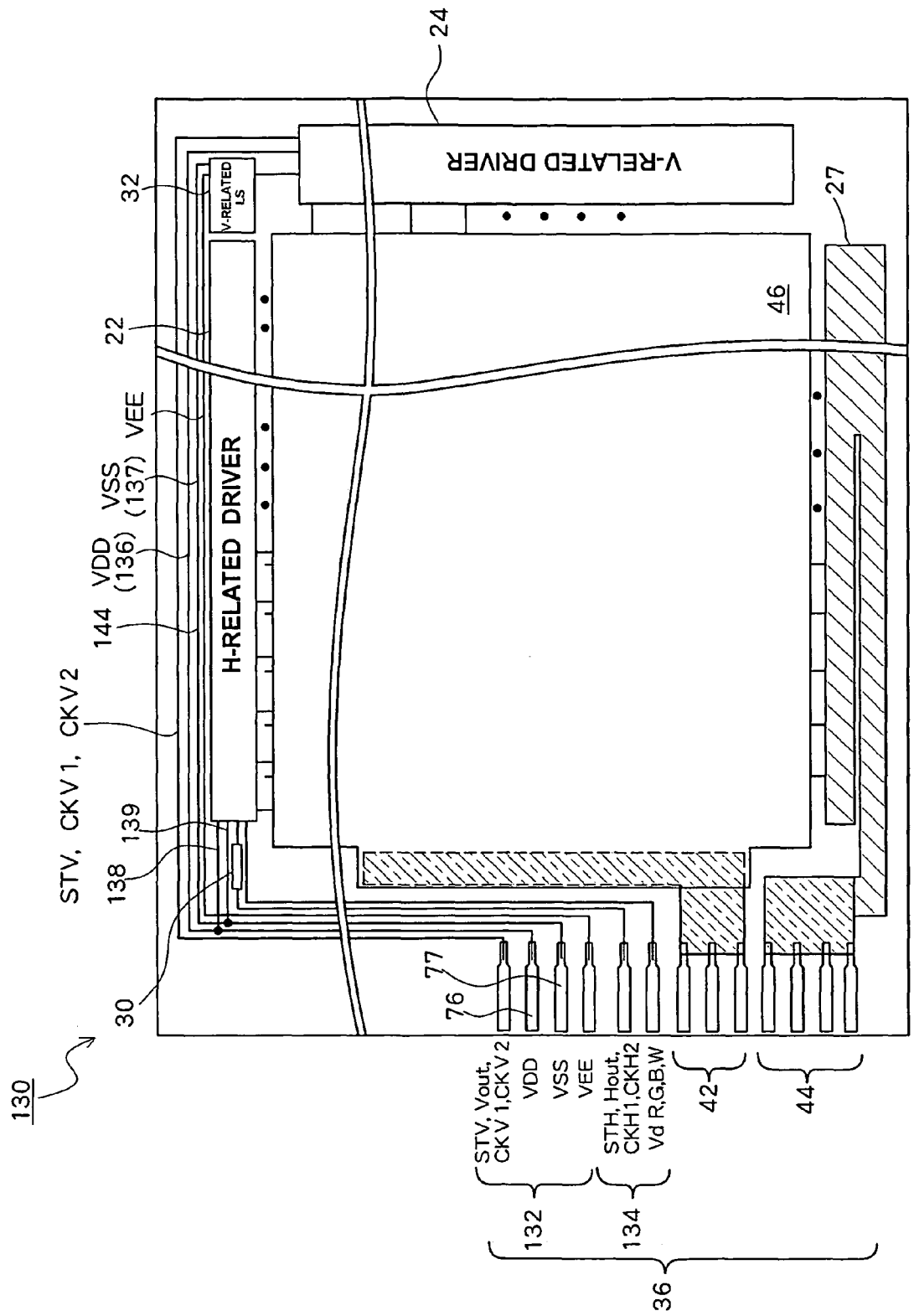
FIG. 9 is a diagram showing a placement of a terminal, a line, a circuit, or the like in an EL display panel according to another preferred embodiment of the present invention.

As shown in the figure, although the bridge line 80 is electrically connected to the two power supply lines 78a and 78b for the higher voltage, the bridge line 80 is a different layer from the lines 78a and 78b and is formed using a refractory metal layer such as Cr identical to the gate electrode 88 of the TFT. By forming the bridge line 80 with a metal layer separate from the power supply line, even when the line 79 for the lower voltage power supply formed using the same metal layer as the two lines 78a and 78b for the higher voltage power supply is placed, in a plan view, between the two lines 78a and 78b for the higher voltage power supply as shown in FIG. 9, the lines 78a and 78b for the higher voltage power supply can be connected to each other without short-circuiting with the line for the lower voltage power supply. In addition, the formation area of the bridge line 80 and the connection area of the power supply liens 78a and 78b can be set at a large area as long as these structures do not overlap the lines or the like formed of the same metal layer as the other gate electrodes. In this manner, by connecting the power supply lines provided in a plurality and having the same voltage by the bridge line 80 at least at an end region of a driver, of the H-related driver 22 and the V-related driver 24, which is closer to the external connection terminal and which requires a high speed operation (in the embodiment, the H-related driver 22), the resistance of the power supply line can be reduced and the voltage drop can be inhibited.

The power supply lines 78a, 78b, and 79 are covered by the first planarizing insulating layer 96 along with the drain electrode 92S, source electrode 94, other lines, and interlayer insulating layer 90.

FIG. 9 is a diagram showing extension of lines in an organic EL display panel 130 according to another preferred embodiment of the present invention. The lines in the display regions are similar to those in FIG. 3 and will not be described again. The structures similar to those in the organic EL display panel 10 of FIG. 4 are assigned the same reference numerals and will not be described again. In the organic EL display panel 130, a portion of the power supply lines for the H-related driver and the V-related driver and the external connection terminals related to the power supply lines are shared, and the power supply lines branch at a partway and extend toward the drivers.

An external connection terminal (V-related terminal) 132 related to the V-related driver 24 and an external connection terminal (H-related terminal) 134 related to the H-related driver 22 share terminals 76 and 77 to which the power supplies for both drivers (VDD and VSS) are supplied. A line 136 for a higher voltage power supply (VDD) and a line 137 for a lower voltage power supply (VSS) extending from the terminal toward the V-related driver 24 passes on a route external to the H-related driver 22 and reaches the V-related driver 24 on the right side of the panel. Power supply lines 138 and 139 for the H-related driver branch from the power supply lines 136 and 137 at the upper left corner, extend toward right (along the horizontal scan direction), and extend to the H-related driver 22. A level shifter 30 is provided near the branching point in order to set signals, among the signals on the H-related external connection terminals 134, such as the clock signals CKH1 and CKH2 and horizontal start signal STH to a sufficient amplitude. If the level shifting operation is not necessary, the level shifter 30 may be omitted.

With this structure also, the number of external connection terminals and the number of lines for the power supply lines at the left side can be reduced, along with the number of locations and amount of space required for placing these structures. Similar to the above-described organic EL display panels 10 and 70, the power supply lines are provided only on the left side, upper side, and right side, and are not formed on the lower side which opposes the side on which the H-related driver 22 is formed. With this structure, the space for the element drive current common line 27 can be maximized at the lower side of the panel. In addition, because the number of lines on the left side can be reduced, the widths of the frame portions on the right side and on the left side can be matched or set to be close to each other.

Figure 10:
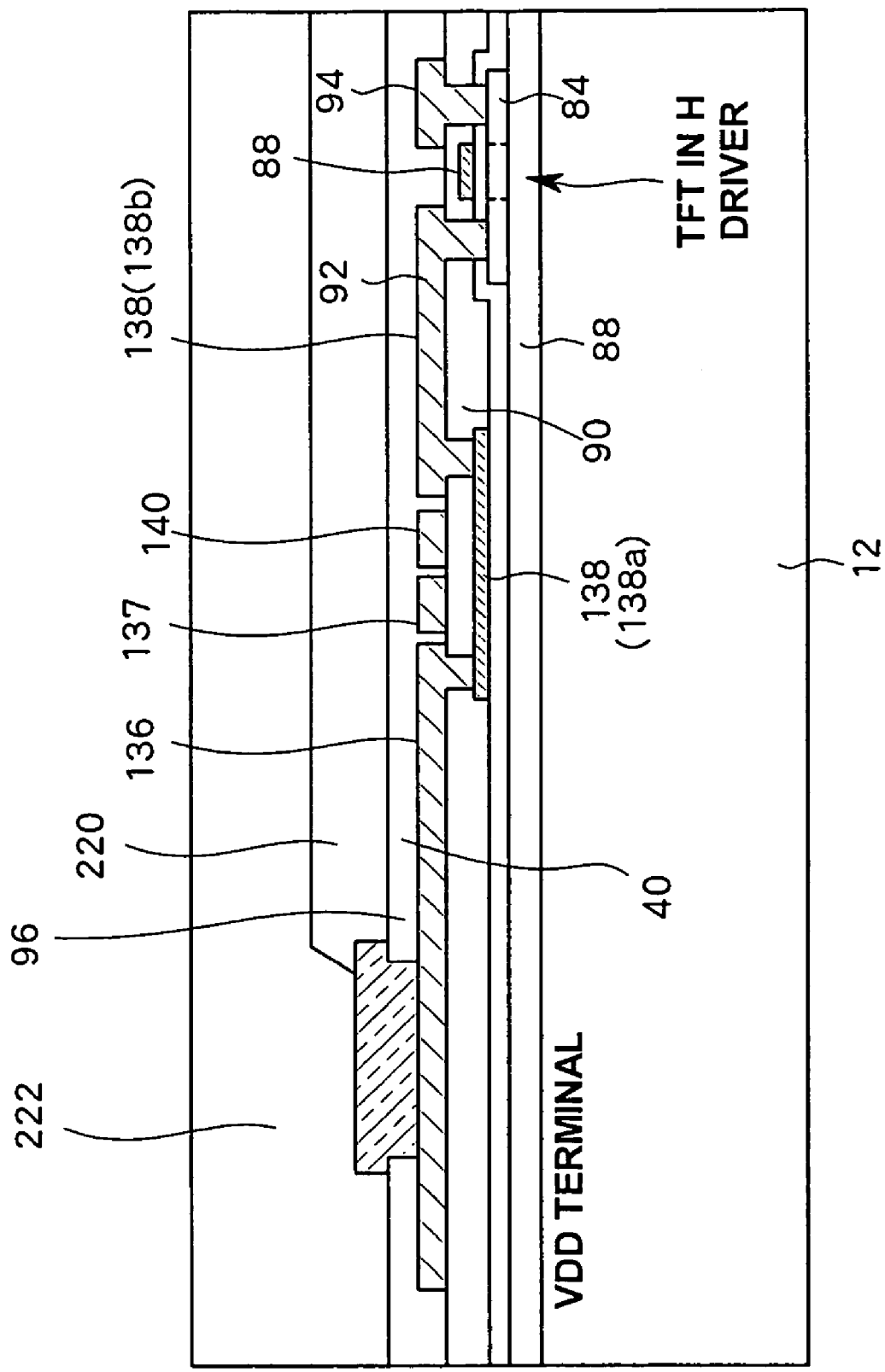
FIG. 10 is a diagram diagrammatically showing a cross section of the preferred embodiment of FIG. 9.

FIG. 10 is a diagram exemplifying a cross sectional structure when the line 138 for the higher voltage power supply for the H-related driver is branched from the line for the higher voltage power supply for the V-related driver 24 as described above. In such a case, the line 139 for the lower voltage power supply may similarly be of the branching structure. As the connection structure for the line for the lower voltage power supply is similar to that for the line for the higher voltage power supply, the connection structure for the line for the lower voltage power supply will not be described. The illustrated layers basically have the same structure as those in FIG. 8, and thus, are assigned the same reference numerals as FIG. 8 and will not be described again.

The line 136 for the higher voltage power supply (VDD) for the V-related driver which extends from the VDD terminal and is formed by a metal layer of Mo/Al/Mo is connected to a branch line 138a of the line 138 for the H-related power supply via a contact hole at a branching portion. The branching line 138a is a line which is formed simultaneously with the gate electrode 88 of the thin film transistor (TFT) and is made of the refractory metal layer such as Cr. The other line 137 for the lower voltage power supply for the V-related driver and a line 140 for power supply of yet lower voltage (VEE) are provided in parallel to the line 136 for the higher voltage power supply for the V-related driver. The branch line 138a needs to be insulated from these other power supply lines for the V-related driver, and, thus, is placed below the interlayer insulating layer 90 formed below the layer for these power supply lines, in a manner to cross the formation region of the layer of the power supply lines. A contact hole is formed through the interlayer insluting layer 90 also at a position crossing the layer below the power supply lines for the V-related driver and the branch line 138a is connected through the contact hole to the H-related power supply line 138b which is formed in the same layer as the V-related power supply line 136, etc.

The above-described embodiments are described using an example in which the external connection terminal is placed on the left side. The present invention, however, is not limited to such a configuration, and the external connection terminal may alternatively be provided on the right side. In such a case, the V-related driver is placed on the left side and the connection point of the cathode power supply or the like is placed on the right side. The external connection terminal may alternatively be placed on the lower side, in which case the H-related driver is placed on the side opposing the lower side, that is, on the upper side and the V-related driver is placed on the left side or on the right side. The power supply line for the drivers extend from the lower side on which the external connection terminals are placed, through the left side or the right side on which the V-related driver is placed, and toward the upper side on which the H-related driver is placed.

What is claimed is:

1. An electroluminescence display device comprising:
   a display panel having a display portion in which pixels are arranged in a matrix;
   a horizontal scan driver circuit and a vertical scan driver circuit each of which is formed at a periphery of the display portion and each of which drives the pixels; and
   a drive current common line for supplying an electric power to an electroluminescence element;
   wherein an external connection terminal is placed on a first side of the display panel;
   one of the horizontal scan driver circuit and the vertical scan driver circuit is placed on a second side of the display panel which opposes the first side and the other of the horizontal scan driver circuit and the vertical scan driver circuit is placed on a third side of the display panel which is one of two sides connecting the first side and the second side;
   the drive current common line is placed on a fourth side of the display panel which opposes the third side; and
   each of a power supply line for the horizontal scan driver circuit and a power supply line for the vertical scan driver circuit extends from the external connection terminal to a region of formation of a corresponding one of the horizontal scan driver circuit and the vertical scan driver circuit without passing through a side other than the first side, the second side, and the third side.

2. An electroluminescence display device according to claim 1, wherein
   the vertical scan driver circuit is formed on the second side along the vertical scan direction.

3. An electroluminescence display device according to claim 2, wherein
   the power supply line for the horizontal scan driver circuit and the power supply line for the vertical scan driver circuit are connected to a common external connection terminal.

4. An electroluminescence display device according to claim 2, wherein the power supply line for the horizontal scan driver circuit and the power supply line for the vertical scan driver circuit are connected in series.

5. An electroluminescence display device according to claim 4, wherein
of the power supply line for the horizontal scan driver circuit and the power supply line for the vertical scan driver circuit, a power supply line having a longer line distance from the external connection terminal has a narrower width than a power supply line having a shorter line distance from the external connection terminal.

6. An electroluminescence display device according to claim 4, wherein
the power supply line for the horizontal scan driver circuit and the power supply line for the vertical scan driver circuit include a line for a higher voltage power supply and a line for a lower voltage power supply, at least one of which are provided in a plurality, and
the plurality of power supply lines are electrically connected to each other by a bypass line which is formed of a conductive layer different from a material for the power supply line at least at an end region of a driver circuit, of the horizontal scan driver circuit and the vertical scan driver circuit, having a shorter power supply line distance from the external connection terminal.

7. An electroluminescence display device according to claim 1, wherein
the power supply line for the horizontal scan driver circuit and the power supply line for the vertical scan driver circuit are connected to a common external connection terminal.

8. An electroluminescence display device according to claim 1, wherein
the power supply line for the horizontal scan driver circuit and the power supply line for the vertical scan driver circuit are connected in series.

9. An electroluminescence display device according to claim 8, wherein
of the power supply line for the horizontal scan driver circuit and the power supply line for the vertical scan driver circuit, a power supply line having a longer line distance from the external connection terminal has a narrower width than a power supply line having a shorter line distance from the external connection terminal.

10. An electroluminescence display device according to claim 8, wherein
the power supply line for the horizontal scan driver circuit and the power supply line for the vertical scan driver circuit include a line for a higher voltage power supply and a line for a lower voltage power supply, at least one of which are provided in a plurality, and
the plurality of power supply lines are electrically connected to each other by a bypass line which is formed of a conductive layer different from a material for the power supply line at least at an end region of a driver circuit, of the horizontal scan driver circuit and the vertical scan driver circuit, having a shorter power supply line distance from the external connection terminal.

11. An electroluminescence display device according to claim 1, wherein
the power supply line for the horizontal scan driver circuit and the power supply line for the vertical scan driver circuit are connected to a common external connection terminal, branch on a line route extending from the common external connection terminal, and are connected to the respective driver circuits.

12. An electroluminescence display device according to claim 1, wherein
each of a signal line for the horizontal scan driver circuit and a signal line for the vertical scan driver circuit extends from the external connection terminal to a region of formation of a corresponding one of the horizontal scan driver circuit and the vertical scan driver circuit without passing through a side other than the first side, the second side, and the third side.

13. An electroluminescence display device according to claim 1, wherein
the external connection terminal is connected to a flexible printed circuit.

14. An electroluminescence display device according to claim 1, wherein
a level shifter which changes an amplitude of a signal input to the horizontal scan driver circuit or the vertical scan driver circuit is provided.

15. An electroluminescence display device, comprising:
a display panel having a display portion in which pixels are arranged in a matrix; and
a first driver circuit which structured to perform a relatively high speed circuit operation and a second driver circuit structured to perform a relatively low speed circuit operation, each of which is formed at a periphery of the display portion and each of which drives the pixels, wherein
an external connection terminal is placed on a first side of the display panel;
the second driver circuit is placed on a second side of the display panel which opposes the first side;
the first driver circuit is placed on a third side of the display panel which is one of two sides connecting the first side and the seconds side;
the first driver circuit is connected to the external connection terminal through a first line and the second driver circuit is connected to the first line through a second line; and
the first line is wider than the second line.

16. An electroluminescence display device according to claim 15, wherein
a power supply line for the first driver circuit and a power supply line for the second driver circuit are connected to a common external connection terminal.

17. An electroluminescence display device according to claim 15, wherein
a contact region between a common electrode of an electroluminescence element in each pixel and a common electrode line extending from an external connection terminal corresponding to the common electrode is placed on the first side.

18. An electroluminescence display device, comprising:
a display panel having a display portion in which pixels are arranged in a matrix and a first driver circuit and a second driver circuit each of which is formed at a periphery of the display portion and each of which drives the pixels, wherein
an external connection terminal is placed on a first side of the display panel;
the second driver circuit is placed on a second side of the display panel which opposes the first side;
the first driver circuit is placed on a third side of the display panel which is one of two sides connecting the first side and the second side;
each of the first driver circuit and the second driver circuit includes a shift register and a selection signal output circuit which outputs a selection signal for turning a selection transistor of the pixel ON at predetermined timing;

the first driver circuit or the second driver circuit is connected to the external connection terminal through a high voltage side power supply line and a low voltage side power supply line; and the high voltage side power supply line is formed of a plurality of lines.

19. An electroluminescence display device according to claim 18, wherein a contact region between a common electrode of an electroluminescence element in each pixel and a common electrode line extending from an external connection terminal corresponding to the common electrode is placed on the first side.

20. An electroluminescence display device comprising:
a display portion in which pixels are arranged in a matrix;
a first driver circuit which performs a relatively high speed circuit operation and a second driver circuit which performs a relatively low speed circuit operation, each of which being formed at a periphery of the display portion and each of which driving the pixels; and
a drive current common line for supplying an electroluminescence element;
wherein external connection terminals of the display device are placed on a first side of the display device;
the second driver circuit is placed on a second side of the display device which opposes the first side;
the first driver circuit is placed on a third side of the display device which is one of two sides connecting the first side and the second side;
the external connection terminals include a second terminal connected to the second driver circuit, a first terminal for the first driver circuit, and a terminal for a pixel drive power supply, and
an order of arrangement of these terminals is, from an upper side along the vertical scan direction of the display panel, the terminal for the horizontal scan driver circuit, the terminal for the cathode power supply, and the terminal for the pixel drive power supply;
wherein a line which connects the second terminal to the second driver circuit is placed such that the line passes through a region between the first driver circuit and an edge of the electroluminescence display device.

21. An electroluminescence display device according to claim 20, wherein the first driver circuit is horizontal scan driver circuit and the second driver circuit is a vertical scan driver circuit; and an order of arrangement of the external connection terminals is, from an upper side of the display device, the terminal for a vertical scan related line, the terminal for a horizontal scan related line, the terminal for a cathode power supply, and the terminal or the pixel drive power supply.

22. An electroluminescence display device according to claim 20, wherein the first driver circuit is provided adjacent to an upper side of the display portion of the display panel;

a cathode power supply connection portion is provided on a side adjacent to the first side of the display portion on which the external connection terminals are placed, the second driver circuit is a vertical scan driver circuit, and a pixel drive power supply line is provided adjacent to a lower side of the display portion.

23. An electroluminescence display device according to claim 22, wherein a center of the group of external connection terminals which are provided is placed at a lower position than a center position of the display portion along the vertical scan direction.

24. An electroluminescence display device according to claim 22, wherein a level shifter which shifts a signal level of at least one of a clock signal and a vertical start signal to be supplied to the vertical scan driver circuit is placed at a corner formed by a side on which the vertical driver circuit is provided and a side on which a line for the signal for which the signal level is to be shifted is placed.

25. An electroluminescence display device comprising:
a display portion provided on a display panel, the display portion comprising pixels arranged in a matrix; and
a first driver circuit and a second driver circuit, each of which being formed at a periphery of the display portion and each of which driving the pixels;
wherein an external connection terminal is placed on a first side of the display panel;
the second driver circuit is placed on a second side which opposes the first side;
the first driver circuit is placed on a third side which is one of two sides connecting the first side and the second side;
the first driver circuit or the second driver circuit is connected to the external connection terminal through a plurality of high voltage side power supply lines and a low voltage side power supply line; and
the plurality of high voltage side power supply lines are connected with each other via a bridge circuit.

26. An electroluminescence display device according to claim 25, wherein the second driver circuit is a vertical scan driver circuit.

27. An electroluminescence display device according to claim 26, wherein a level shifter which shifts a signal level of at least one of a clock signal and a vertical start signal to be supplied to the vertical scan driver circuit is placed at an end at which a side on which the vertical scan driver circuit is placed and a side on which a line for the signal for which the signal level is to be shifted is placed cross each other.

28. An electroluminescence display device comprising:
a display portion provided on a display panel, the display portion comprising pixels arranged in a matrix;
an external connection terminal placed along a first lateral side of the display panel, and
a vertical scan driver circuit placed on a second lateral side of the display panel which opposes the first lateral side on which the external connection terminal is placed.

* * * * *